United States Patent [19]

Weiss et al.

[11] Patent Number: 5,409,788

[45] Date of Patent: Apr. 25, 1995

[54] METHOD FOR SECURING A TESTER DEVICE TO A BATTERY AND THE BATTERY SO PRODUCED

[75] Inventors: Victor H. Weiss, Plantation, Fla.; David P. McConnon, Monticello, Minn.

[73] Assignee: Eveready Battery Company, Inc., St. Louis, Mo.

[21] Appl. No.: 56,157

[22] Filed: May 3, 1993

[51] Int. Cl.⁶ .............................................. H01M 2/02
[52] U.S. Cl. ..................................... 429/93; 429/90; 429/91; 429/92; 324/345
[58] Field of Search ........................... 429/93; 324/345

[56] References Cited

U.S. PATENT DOCUMENTS

| | | | |
|---|---|---|---|
| 4,680,527 | 7/1987 | Benenati et al. | 429/93 X |
| 4,702,563 | 10/1987 | Parker | 350/351 |
| 4,702,564 | 10/1987 | Parker | 350/351 |
| 4,737,020 | 4/1988 | Parker | 350/351 |
| 4,835,475 | 5/1989 | Hanakura et al. | 324/435 |
| 5,015,544 | 5/1991 | Burroughs et al. | 429/93 |
| 5,059,895 | 10/1991 | Cataldi et al. | 324/435 |
| 5,156,931 | 10/1992 | Burroughs et al. | 429/93 |
| 5,223,003 | 7/1993 | Tucholski et al. | 29/623.4 |

Primary Examiner—Stephen Kalafut
Assistant Examiner—M. Nuzzolillo
Attorney, Agent, or Firm—Robert W. Welsh

[57] ABSTRACT

A method for encasing a battery with a label containing an integral test circuit device that is thermally insulated from the battery and is activated by depressing a selected area of the label whereupon a thermally sensitive material associated with the test circuit displays whether the battery has capacity. The battery so produced with the test circuit device is also disclosed.

19 Claims, 3 Drawing Sheets

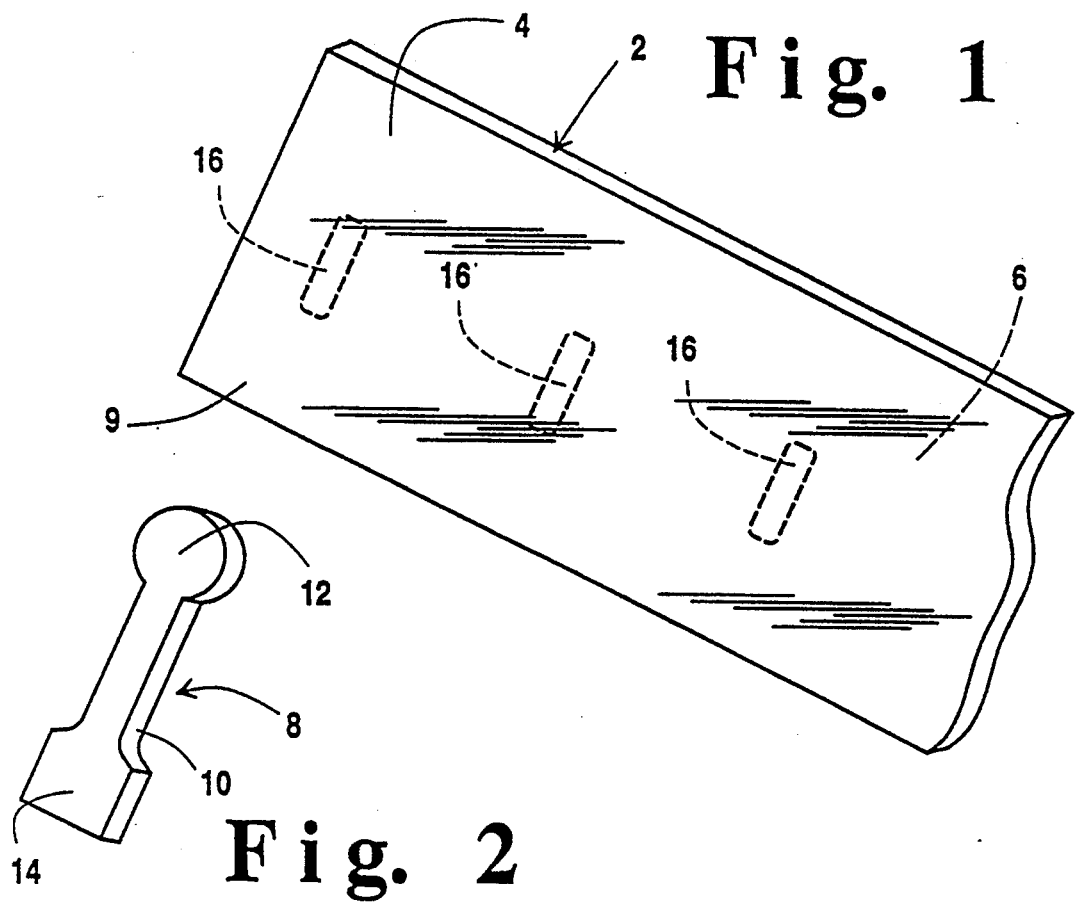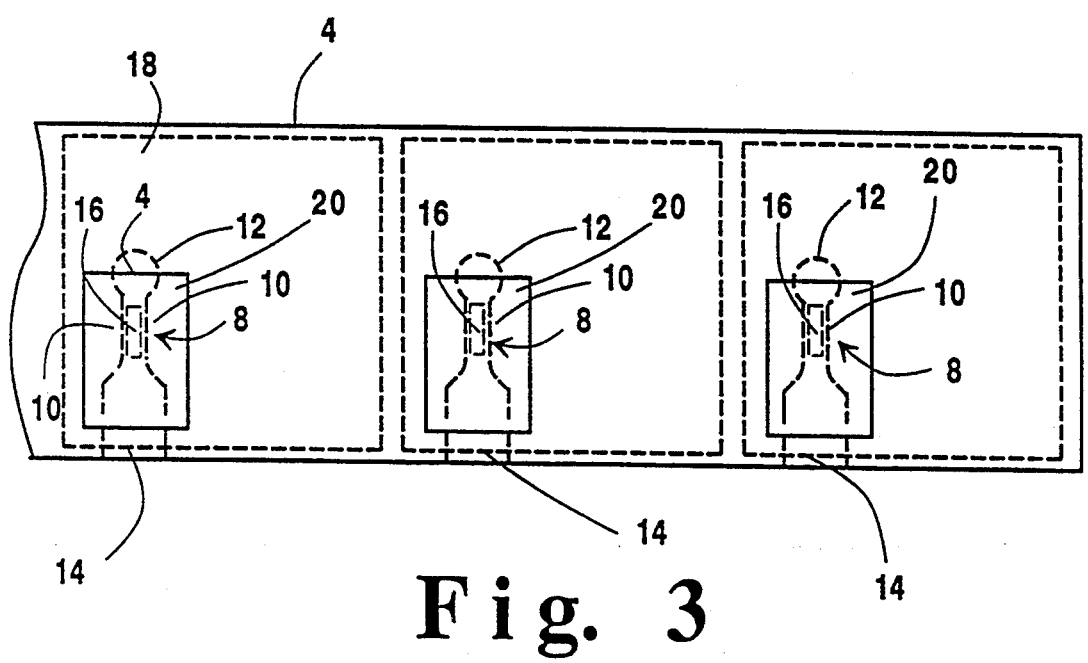

5,409,788

METHOD FOR SECURING A TESTER DEVICE TO A BATTERY AND THE BATTERY SO PRODUCED

FIELD OF THE INVENTION

The invention relates to a method for securing a tester device to a battery in which the tester device forms an integral part of the label encasing the battery.

BACKGROUND OF THE INVENTION

Batteries are generally stored for various periods of time before being put into use. The batteries can be stored by the seller and frequently when purchased they are again stored by the buyer prior to being put to use. It is therefore desired to have some sort of testing means for determining if a battery has sufficient charge to operate a desired device. Initially, separate battery testers were developed which could measure the strength remaining in the battery. Recently battery testers have been developed that either are included in the battery package or assembled in the label secured to the battery. The testers generally indicate the capacity remaining in the battery.

U.S. Pat. No. 4,702,564 discloses a device for testing a battery, particularly a small, portable battery, comprising a flexible, transparent substrate on which is deposited a narrow band of a black light absorbing material. A conductive material, which may taper outwardly in opposite directions from a central point to a pair of outer terminals, is then deposited atop the substrate on the same side of the substrate as the absorber layer or on the opposite side of the substrate as the absorber layer. A layer of a chloesteric liquid crystal material is then deposited on the substrate on the opposite side from the black absorber layer or over the absorber layer. The conductive material is an epoxy cement-based conductor, preferably silver, printed or painted directly on the substrate. An indicator scale is located along sections of the conductive material. To test a dry cell battery, the terminal ends of the conductive material are placed in contact with the battery terminals, causing a current to flow which heats the conductive material, the heat generated being the most intense at the central point and radiating outwardly. The heat is transferred through the thin substrate to the liquid crystal layer which results in a color change in the liquid crystal. The traverse of the color change along the length of the indicator scale, outwardly from the center point, is proportional to the current or voltage output or the condition of the battery to be tested and can be read on the indicator scale which is calibrated accordingly. The tester also includes means for determining the amp-hours or life of a battery.

U.S. Pat. No. 5,015,544 discloses a battery strength indicating and switch means on a battery which is coupled across the terminals of the battery and which is provided with an indicating means to indicate the strength of the battery and in addition, the battery strength indicating means is also provided with an in-line switch which can easily be depressed to complete the circuit so as to place the indicator means across the terminals of the cell and display the charge of the battery.

U.S. Pat. No. 5,059,895 discloses a battery voltmeter comprising:

(A) a dielectric layer;

(B) a conductive layer above or below one of the surfaces of the dielectric layer; and (C) a temperature sensitive color indicator layer in thermal contact with the conductive layer, characterized in that the conductive layer has (i) thermal insulating means under one of its surfaces and (ii) sufficient heat generating capacity to affect a change in the temperature sensitive color indicator layer. The voltmeter can be integrated into a label and attached directly to a battery.

U.S. Pat. No. 4,835,475 discloses an apparatus for indicating the electromotive force of a dry battery which comprises:

(i) a film base;

(ii) an electrically conductive layer disposed on one side of the film base, (iii) a protective layer disposed on the electrically conductive layer, and (iv) a thermochromic layer disposed on the other side of the film base.

An object of the present invention is to provide a method for producing a battery tester device which is assembled with the battery label and which has few components thus making it easy to assemble.

Another object of the present invention is to provide a method for producing a battery tester device integral with the battery label that is cost effective to produce and suitable for efficient automatic assembly operation.

Another object is to provide a battery tester label for a battery.

DESCRIPTION OF THE INVENTION

The invention relates to a method for preparing and attaching a battery test label to a battery having a first terminal and a second terminal which comprises the steps:

(a) preparing a non-conductive base film, having a top surface and bottom surface, depositing on the top surface a thermally sensitive material, and depositing on the bottom surface an adhesive layer;

(b) preparing a conductive circuit layer having a top surface and a bottom surface and then securing the top surface of the conductive circuit layer to the bottom surface of the non-conductive base film and locating said conductive circuit layer such that a first area of the conductive circuit layer will be deposed over the first terminal and a second area will be disposed over the second terminal of the battery when the base film is secured to the battery;

(c) depositing a non-conductive releasable film over the bottom surface of the base film, said releasable film having a cut portion disposed over the conductive circuit layer between the first area and the second area of said conductive circuit layer so that, when the releasable film is removed, the area between the first area and second area of the conductive circuit layer will be covered by the cut portion of said releasable film;

(d) removing the releasable film from the bottom surface of the base film leaving the cut portion of the releasable film over at least the area between the first area and second area of the conductive circuit layer so that the first area and second area of the conductive circuit layer are exposed; and (e) adhering the bottom surface of the base film to the battery such that the first area of the conductive circuit layer is positioned over the first terminal and the second area of the conductive circuit layer is positioned over the second terminal so that said first area can be deflected to contact the first terminal and said second selected area can be deflected to contact the second terminal to complete an electrical circuit between the terminals that will cause current to flow through the conductive circuit layer creating heat that will be detected by the thermally sensitive material.

The invention also relates to a battery having a first terminal and a second terminal of opposite polarity; said battery at least partially encased with a non-conductive film having a top surface and bottom surface; a conductive circuit layer disposed on at least a portion of the bottom surface and extending such that a first area is disposed over the first terminal and a second area is disposed over the second terminal; a non-conductive material disposed over a portion of the conductive circuit layer so that the first and second areas disposed over the first terminal and second terminal, respectively, are not covered by the non-conductive material, so that the first area can be deflected to contact the first terminal and the second area can be deflected to contact the second terminal with the remainder of the conductive circuit layer being electrically and thermally insulated from the terminals of the battery by the non-conductive material; a thermally sensitive material disposed in responsive contact with the conductive circuit layer such that when the first area and second area of the conductive circuit layer contact the first terminal and second terminal, respectively, a current will flow through the conductive circuit layer and heat the thermally sensitive material which will indicate whether the battery has any capacity.

The cut portion of the releasable film can be any geometric shape provided it leaves the first area and the second area of the conductive circuit layer exposed to contact the respective terminals of the battery. Preferably, the cut portion of the releasable film can be designed to provide an opening over the first area of the conductive circuit layer so that said area would be disposed over the first terminal of the battery which is preferably the container housing for the battery. At the opposite end of the cut portion of the releasable film a groove could be provided, if needed, so that the second area of the conductive circuit layer would be exposed to contact the second terminal of the battery which preferably will be the cover of the battery. The use of a cut portion of the nonconductive releasable film as an electrical and thermal insulator provides a cost effective production technique for producing a tester device as an integral part of a battery label. In normal operations, the releasable film is discarded but in the subject invention a portion of the releasable film can be used to electrically insulate the area between the first area and second area of the conductive circuit layer from the first and second terminals of the battery so that a complete circuit will be provided only when the first area and second area can contact the first terminal and second terminal, respectively, of the battery. In addition, the cut portion of the releasable film can function as a thermal insulator so that the thermally sensitive material will be insulated from the battery housing so that the battery housing cannot function as a heat sink. A suitable releasable film would be silicone-coated paper. Preferably, the thickness of the releasable film should be such that it maintains a separation of at least one terminal of the battery from the respective area of the conductive circuit layer so that the battery label will have to be depressed to cause the area of the conductive circuit layer to contact the terminal of the battery.

Preferably, the releasable film thickness should be between about 0.001 and 0.006 inch, and more preferably between 0.002 and 0.004 inch.

In one embodiment of the invention, an outer film can be disposed over the base film containing the battery tester device and said base material and/or the outer film can contain printed and graphic design matter for the battery. A suitable outer film would be polyester, polyvinyl chloride or the like. The batteries useful in this invention are primary or secondary batteries that have positive and negative terminals. The batteries are generally comprised of an anode, a cathode and electrolyte contained in a sealed housing. The housing typically has an opening in one end that is sealed and closed with a cover. This cover is usually in electrical contact with either the cathode or anode to provide a terminal of the battery while the terminal of opposite polarity, generally the battery housing, is usually in electrical contact with the other electrode. The test device label of this invention, in addition to providing a label for the battery, provides a test device that can be integral with the label and thereafter becomes an integral part of the battery. The test device operates such that by depressing one or two selected areas of the conductive circuit layer, the circuit is completed between the terminals of the battery via the conductive circuit layer which in turn generates heat which is detected by the thermally sensitive material to provide a visual indication of the strength of the battery. If the conductive circuit layer is disposed close to the housing of the battery which is usually a metallic material, then such housing can be used as a heat sink. If this occurs, the heat generated in the conductive circuit layer may be insufficient to be properly detected by the thermally sensitive material and may thereby provide inaccurate information as to the strength of the battery. In the present invention, the cut portion of the releasable film will act as a thermal and electrical insulation for the conductive layer.

The base film can be made of any desired dielectric polymer material. It is preferable to use a dielectric polymer material that will shrink when assembled on a battery. Generally, polyvinyl resins, polyolefin resins, polyester resins and the like would be suitable. Specific examples would be polyvinyl chloride, polyethylene, and polypropylene. The thickness of the film is not particularly limited but could be in the range of about 0.0005 to 0.005 inch, preferably 0.001 to 0.003 inch.

The electrically conductive circuit layer can be a metallic foil such as silver, nickel, iron, copper, lead, etc., and mixtures thereof or a metallized plastic layer. Other examples include electrically conductive polymers, paints or inks, such as those that contain graphite, carbon or metals such as silver or combinations thereof which could be applied onto a substrate as the conductive layer. Hot stamping of conductive material onto the substrate could also be used. Preferably the conductive circuit layer is formed as a separate part, preferably on a nonconductive substrate and shaped to have first and second segment ends that are connected to each other via an area of controlled resistivity. The first segment is provided to contact a first terminal of the battery and the second segment is provided to make contact with the second terminal of the battery. Thus, when the conductive circuit layer makes contact with both terminals of the battery, an electric current will flow through the area of controlled resistivity which will heat the conductive circuit layer to a range sufficient to activate the thermally sensitive material. The resistance in the area of controlled resistivity can vary or it can be constant dependent on the particular application of use.

The testing means also comprises a means for indicating the capacity of the battery. The indicating means will be in responsive contact with the area of controlled resistivity and will respond to and indicate the capacity of the battery. For example, a temperature will be generated in that area when a current flows through the conductive circuit layer. Thermally sensitive material will be in thermally transferable contact with the area of controlled resistivity and will indicate to the consumer the capacity of the battery. This indication can be qualitative such as a "good" reading, or quantitative such as a remaining percentage of useful life. The thermally sensitive materials could change color in response to a temperature change and such change in the material would be readily viewable by a consumer. Thus the consumer, based on the color change, can determine whether the battery is good or needs to be replaced. Examples of such thermally sensitive materials are liquid crystal materials and thermochromic inks. Examples of suitable liquid crystal materials are of the cholesteric type, such as cholesteryl oleate, cholesteryl chloride, cholesteryl caprylate and the like. Examples of suitable color thermochromic inks include those comprised of a dye, developer and desensitizing agent that are disclosed in U.S. Pat. No. 4,835,475, herein incorporated by reference. The color indicator material could change from colored to colorless, colorless to colored, or one color to a second color.

The indicating materials such as thermochromic inks can be used singly or in combination. For example, in one embodiment different layers of the indicating material could be employed. The layers are activated at different temperatures or states and can be designed to change different colors at different temperatures. For example, the layer of material activated at the highest temperature will preferably be the bottom layer, and the upper layers are arranged in decreasing temperatures of activation with lowest temperature material in the top layer.

Either one or both terminal contact segment ends of the conductive circuit could be out of contact with the respective terminals of the battery so that the tester circuit is open. In one embodiment of the invention either the anode or cathode is in electrical contact with the conductive housing of the battery. In this embodiment, one of the terminal contact segments ends of the tester circuit can be permanently connected to one terminal of the housing while the other contact end is positioned out of contact with the other terminal of the housing by an opening or the like formed in the cut portion of the releasable film. This opening can act as a switch for the tester circuit. By forcing the circuit contact area end into contact with the housing through the opening, the switch is closed and the tester circuit is completed to test the battery. This contact can be conveniently made by applying finger or thumb pressure to the switch areas.

The labels useful in this invention can also comprise additional insulative layers, printing layers, protective layers and the like. Suitable materials for use as the different layers are those typically used in battery labels and include plasticized or unplasticized polyvinyl chloride (UPVC), polyesters, metallic films, paper and like, and they are prepared by known methods, such as laminating the layers together. The label can be attached to the battery by the use of an adhesive. The tester label can be in the form of a single ply label or a shrinkable tube label in which a battery is encased.

A preferred tester label is comprised of a base insulative film adhered to the housing of the battery by a suitable adhesive. The housing is in electrical contact with either the anode or cathode of the battery. A tester circuit is placed on the bottom surface of this insulative film and then the cut portion of the releasable film is used to electrically insulate the middle portion of the circuit layer from the terminals. One of the terminal contact areas of the circuit is in contact with and secured to the terminal of the battery (generally the cover) that is not in contact with the housing. The area of the base film onto which the tester circuit is placed contains the cut portion of the releasable film as described above to function as an electrical and thermal insulation means for said tester circuit. The thermal indicating material is placed over the area of controlled resistivity of the circuit. The indicating material can be placed directly on the tester circuit, provided that the indicating material is visible externally, or it can be placed on a separate layer that is placed over the tester circuit. Preferably, the indicating material is a thermochromic ink and is in thermally transferable contact with the area of controlled resistivity. Finally, a protective layer can be placed over the indicating material. The type of protective layer is selected so that the indicating material can be observed by the user. To test the battery, the user will press the label at the point above one or both areas in the insulator film to establish contact with the terminals of the battery housing. As the circuit is completed, a temperature increase will be generated in the area of controlled resistivity which will be transferred to the indicating material. If the desired temperature level is reached, the indicating material will so indicate and the user can determine the amount of capacity remaining in the battery.

One way to dispense the test circuit label on the battery in a continuous operation is to first prepare a base film, such as a plastic film, made with graphics and printed matter, as well as a thermally sensitive material such as thermochromic ink, on the top side along with an adhesive on the bottom side. In a separate operation, a desired shaped circuit tester layer is deposited on the bottom side of the base film. The thermally sensitive material must be aligned so as to be in thermally transferrable contact with the area of controlled sensitivity. The bottom side of the base film is joined with a releasable paper such as silicone-coated paper and then wound on a roll. The releasable material has a cut portion to remain over a portion of the conductive circuit layer as discussed above. If desired, additional graphics could be printed on the base label before an outer layer is secured to the base layer. The completed base layer is cut to a desired size and then fed to another area where the silicone-coated paper is removed, except for the cut portion, and the label is secured to the housing of the battery. If desired, graphics could be placed on the outer layer of the label.

BRIEF DESCRIPTION OF THE INVENTION

FIG. 1 is a perspective view of the base film of this invention.

FIG. 2 is a perspective view of an individual test circuit device of this invention.

FIG. 3 is a plan view of a continuous sheet of a label carrier containing individual test circuit devices of this invention.

Figure 4:
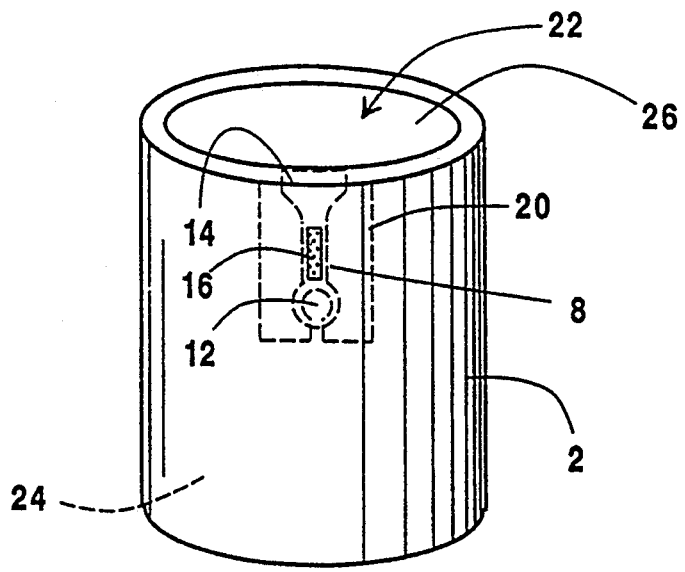
FIG. 4 is a perspective view of a cell employing the test circuit label of this invention.

Referring to FIG. 1 there is shown a base film 2 such as PVC which has a bottom surface 4 and a top surface 6. On top of bottom surface 4 is an adhesive 9. On the top surface 6 is located thermally sensitive material 16, such as a thermochromic material, which will change color upon detection of a particular temperature level.

FIG. 2 shows a test circuit device 8 composed of a conductive film or layer 10 having a first area 12 and a second area 14.

FIG. 3 shows the bottom view of the conductive circuit devices 8 of FIG. 2 secured onto the bottom surface 4 of base film 2. Disposed on top of bottom surface 4 and test circuit devices 8 is a releasable film 18 having a cut portion 20 which is disposed over conductive circuit layer 10 but not over first area 12 and second area 14. Just prior to securing the base film 2 to a battery, the releasable film 18 is removed leaving cut portion 20 over the middle area of conductive circuit layer 10. This exposes first area 12 and second area 14 while cut portion 20 acts as an electrical and thermal insulator for the conductive circuit layer 10. With the releasable film 18 removed, the label is secured to a battery as shown in FIG. 4. Specifically, base film 2 is secured to battery 22 so that the exposed first area 12 of conductive circuit device 8 is disposed over the housing 24 (first terminal) of battery 22 while the exposed second area 14 is disposed over the cover 26 (second terminal) of battery 22. Conductive area 14 can be permanently connected to conductive cover 26. The conductive area 12 is disposed over and is spaced apart (by means of cut portion 20) from the cylindrical housing 24 of the battery 22 which is the first terminal of the battery 22. Thus the circuit between the two terminals of battery 22 via conductive areas 12 and 14 is open. To close the circuit, pressure is applied on the flexible upper layer above area 12. The pressure will cause the conductive segment layer 12 to make electrical contact with the battery housing 24. Rigidity and springback in the label will cause conductive segment layer 12 to break contact with housing 24 when the pressure is released. If desired, conductive segment layer 14 can also be spaced apart from the cover 26 so that to complete the circuit, pressure will have to be simultaneously applied to the flexible upper layer above areas 12 and 14. When the pressure is released, conductive areas 12 and 14 will spring back and break contact with the housing 24 and cover 22, respectively. As stated above, suitable graphics and printed matter can be placed on the base layer, conductive layer, thermally sensitive material and/or an outer layer.

Figure 5:
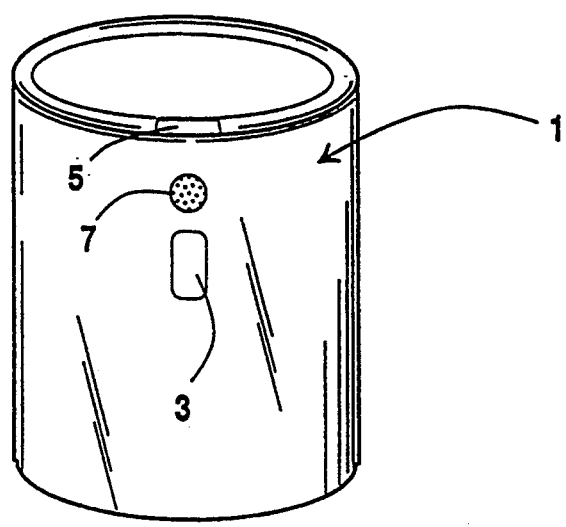
FIG. 5 is a perspective view of a cell employing the test circuit label of this invention encased in an outer layer.

As shown in FIG. 5, an outer layer 1 contains designated areas 3 and 5 which correspond to the first terminal area and second terminal area, respectively, of the cell. Designated area 7 exposes an area of the thermally sensitive material so that when areas 3 and 5 are depressed, a circuit is completed and the thermally sensitive material will change color to indicate the state of charge of the cell. If desired, either area 5 or area 3 could be permanently secured to the second terminal so that only area 3 or area 5, respectively, would have to be depressed to complete the circuit.

Figure 6:
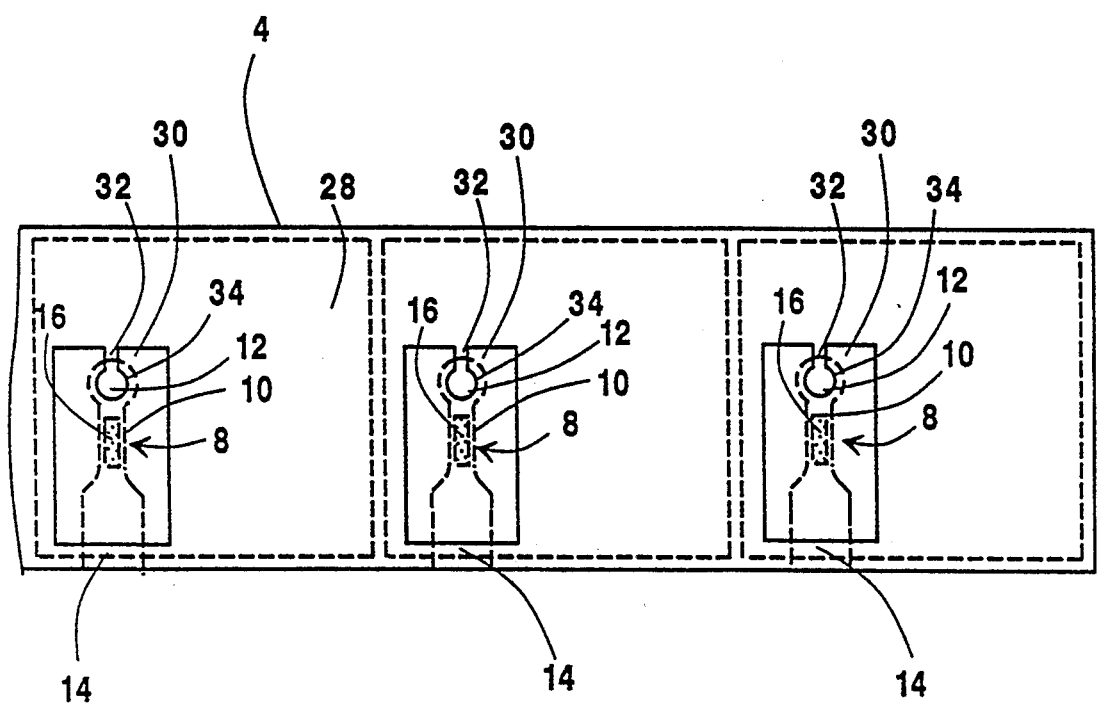
FIG. 6 is a plan view of another embodiment of a continuous sheet of a label carrier containing individual test circuit devices of this invention.

FIG. 6 shows the bottom view of one embodiment of the releasable film 28 having a cut portion 30. As shown, cut portion 30 is designed with a narrow split area 32 terminating with a circular area 34 forming a substantially closed opening when the releasable film is removed. Exposed through area 34 is first area 12 of conductive circuit layer 10 so that before area 12 can make contact with the terminal housing of a battery, it must be depressed and project through opening 34. This embodiment of the invention will insure that the contact of area 12 with the housing of the battery will not accidentally occur and that a positive force will have to be exerted to effect contact. If desired, the circular opening could be any shape such as a square, a rectangle, and the like. Cut portion 30 allows the area 14 of conductive circuit layer 10 to be exposed so as to contact the cover terminal of the battery.

This invention has been described in detail with particular reference to preferred embodiments thereof, but it will be understood that variations and modifications can be effected within the spirit and scope of the invention.

What is claimed is:

1. A method for preparing and attaching a battery test label to a battery having a first terminal and a second terminal which comprises the steps.

(a) preparing a non-conductive base film having a top surface and a bottom surface, depositing on the top surface a thermally sensitive material, and depositing on the bottom surface an adhesive layer;

(b) preparing a conductive circuit layer having a top surface and a bottom surface and then securing the top surface of the conductive circuit layer to the bottom surface of the non-conductive base film and locating said conductive circuit layer such that a first area of the conductive circuit layer will be disposed over the first terminal and a second area will be disposed over the second terminal of the battery when the base film is secured to the battery;

(c) depositing a non-conductive releasable film over the adhesive layer and conductive circuit layer on the bottom surface of the base film, said releasable film having a cut portion disposed over the conductive circuit layer between the first area and the second area of said conductive circuit layer so that, when the releasable film is removed, the area between the first area and second area of the conductive circuit layer will be covered by the cut portion of said releasable film;

(d) removing the releasable film from the adhesive layer and conductive circuit layer on the bottom surface of the base film and leaving the cut portion of the releasable film over at least the area between the first area and second area of the conductive circuit layer so that the first area and second area of the conductive layer are exposed; and (e) adhering the bottom surface of the base film which contains the adhesive layer, cut portion of the releasable film and conductive circuit layer to the battery such that the first area of the conductive circuit layer is positioned over the first terminal of the battery and the second area of the conductive circuit layer is positioned over the second terminal of the battery so that said first area can be deflected to contact the first terminal and said second selected area can be deflected to contact the second terminal to complete an electrical circuit between the terminals that will cause current to flow through the conductive circuit layer creating heat that will be detected by the thermally sensitive material.

2. The method of claim 1 wherein the cut portion of the released film defines a substantially closed opening at one end and said opening is disposed over the first area of the conductive circuit layer.

3. The method of claim 2 wherein the opening is a circular opening.

4. The method of claim 1 wherein the releasable film is from 0.001 to 0.006 inch thick.

5. The method of claim 1 wherein the releasable film is silicone-coated paper.

6. The method of claim 1 wherein the following step is added:
(b) securing a non-conductive film over the top surface of the base film.

7. The method of claim 1 wherein in step (a) the thermally sensitive material is a thermochromic ink.

8. The method of claim 7 wherein in step (b) the conductive circuit layer is silver.

9. An integral battery and battery test label produced by the method of claim 1.

10. The battery of claim 9 wherein the non-conductive material is silicone-coated paper.

11. The battery of claim 9 wherein the non-conductive material is a film having an opening to one end to expose the first area of the conductive circuit layer.

12. The battery of claim 9 wherein the battery comprises a housing composed of a cylindrical container closed at one end and open, at the opposite end and said container forming the first terminal of the battery; a cover secured over and electrically insulated from the open end of the container and said cover forming the second terminal of the batter, said first area of the conductive circuit layer disposed over the first terminal, and said second area of the conductive circuit layer disposed over the second terminal.

13. The battery of claim 9 wherein a heat shrunk film is secured over the battery.

14. The battery of claim 9 wherein the conductive circuit layer is selected from the group consisting of silver, nickel, iron, copper, carbon, lead, conductive polymers, conductive paint, conductive ink and mixtures thereof.

15. The battery of claim 14 wherein the conductive circuit layer is silver.

16. The battery of claim 9 wherein the thermally sensitive material is thermochromic ink.

17. The battery of claim 12 wherein the second area of the conductive circuit layer is permanently secured to the second terminal.

18. The battery of claim 17 wherein the thermally sensitive material is thermochromic ink.

19. The battery of claim 18 wherein the conductive circuit layer is silver.

* * * * *